United States Patent
Susukida et al.

(10) Patent No.: US 6,475,693 B1
(45) Date of Patent: Nov. 5, 2002

(54) POSITIVELY PHOTOSENSITIVE RESIN COMPOSITION

(75) Inventors: Kenji Susukida, Shizuoka; Akio Arano, Minoo; Masato Nishikawa, Shizuoka, all of (JP)

(73) Assignee: Clariant Finance (BVI) Limited, Tortola (VG)

( * ) Notice: Subject to any disclaimer, the term of this patent is extended or adjusted under 35 U.S.C. 154(b) by 0 days.

(21) Appl. No.: 09/622,179

(22) PCT Filed: Dec. 1, 1999

(86) PCT No.: PCT/JP99/06729
§ 371 (c)(1), (2), (4) Date: Aug. 10, 2000

(87) PCT Pub. No.: WO00/34829
PCT Pub. Date: Jun. 15, 2000

(30) Foreign Application Priority Data

Dec. 10, 1998 (JP) ............................................. 10/351581

(51) Int. Cl.⁷ ............................................... G03F 7/023
(52) U.S. Cl. ..................... 430/190; 430/191; 430/192; 430/193; 430/326
(58) Field of Search ................................ 430/190, 191, 430/192, 193, 326

(56) References Cited

U.S. PATENT DOCUMENTS

| | | | |
|---|---|---|---|
| 3,666,473 A | | 5/1972 | Colom et al. |
| 4,115,128 A | | 9/1978 | Kita |
| 4,275,139 A | | 6/1981 | Stahlhofen |
| 4,812,551 A | | 3/1989 | Oi et al. |
| 5,629,128 A | | 5/1997 | Shirakawa et al. |
| 6,210,855 B1 | * | 4/2001 | Ueda et al. ................. 430/190 |
| 6,391,513 B1 | * | 5/2002 | Susukida et al. ........... 430/190 |

FOREIGN PATENT DOCUMENTS

GB 2 172 117 9/1986

OTHER PUBLICATIONS

Derwent Patent Family Abstract for JP 62160444.
Derwent Patent Family Abstract for JP 6067418.
Derwent Patent Family Abstract for JP 10069077.
Derwent Patent Family Abstract for JP 60140235.
Derwent Patent Family Abstract for JP 60097347.
Derwent Patent Family Abstract for JP 60189739.

* cited by examiner

Primary Examiner—John S. Chu
(74) Attorney, Agent, or Firm—Krishna Banerjee

(57) ABSTRACT

A positive-working radiation-sensitive resin composition showing a good throughput upon production of semiconductors or the like and less process dependence of dimensional accuracy as well as having high sensitivity and high resolution, and being able to form a pattern with good shape and a high aspect ratio. The positive-working radiation-sensitive resin composition comprises (i) a radiation-sensitive novolak resin comprising a reaction product between an alkali-soluble novolak resin from which low-molecular-weight components have been removed by fractional treatment and an o-naphthoquinonediazide compound, or a product obtained by removing low-molecular-weight components by fractional treatment from a reaction product between an alkali-soluble novolak resin and an o-naphthoquinonediazide compound, and (ii) a low-molecular compound represented by the general formula (I) and having phenolic hydroxyl group or groups:

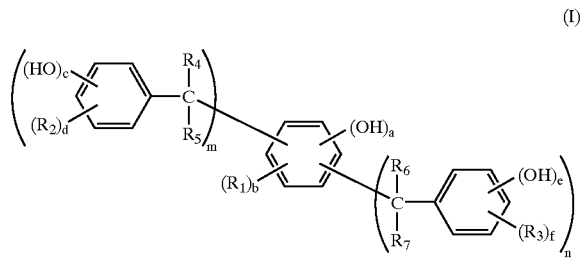

wherein $R_1$, $R_2$, $R_3$, $R_4$, $R_5$, $R_6$ and $R_7$ each represents independently H, a $C_1$ to $C_4$ alkyl group, a $C_1$ to $C_4$ alkoxyl group, a cyclohexyl group or a group represented by the formula:

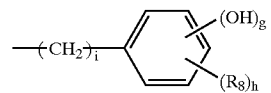

wherein $R_8$ represents H, a $C_1$ to $C_4$ alkyl group, a $C_1$ to $C_4$ alkoxyl group or a cyclohexyl group; each of m and n is 0, 1 or 2; each of a, b, c, d, e, f, g and h is 0 or an integer of 1 to 5 satisfying $a+b \leq 5$, $c+d \leq 5$, $e+f \leq 5$, and $g+h \leq 5$; and i is 0, 1 or 2.

4 Claims, 1 Drawing Sheet

POSITIVELY PHOTOSENSITIVE RESIN COMPOSITION

TECHNICAL FIELD

This invention relates to a novel positive-working radiation-sensitive resin composition and, more particularly, to a positive-working radiation-sensitive resin composition containing a radiation-sensitive novolak resin, suited for manufacture of semiconductors, production of a display surface of liquid crystal display panel, manufacture of a circuit substrate for thermal head etc., and like use.

BACKGROUND ART

In the wide field of manufacturing semiconductor integrated circuits such as LSI, preparing a display surface of liquid crystal display panel, manufacturing a circuit substrate for thermal head etc., and like use, photolithography has so far been employed for forming microelements or conducting fine processing. In the photolithography, a positive- or negative-working radiation-sensitive resin composition is used for forming a resist pattern. Of these radiation-sensitive resin compositions, those compositions containing an alkali-soluble resin and a photosensitizer of quinonediazide compound are most popularly used as the positive-working radiation-sensitive resin compositions. As such compositions, there are described compositions having different formulations as, for example, 'novolak resin/quinonediazide compound' in many documents such as Japanese Examined Patent Publication No. S54-23570 (U.S. Pat. No. 3,666,473), Japanese Examined Patent Publication No.56-30850 (U.S. Pat. No. 4,115,128), Japanese Unexamined Patent Publication Nos. S55-73045, S61-205933 and S62-51459, etc.

These compositions containing a novolak resin and a quinonediazide compound have so far been studied with respect to both novolak resins and photosensitizers. In respect of novolak resins, there have been developed novel resins. In addition, radiation-sensitive resin compositions having excellent properties have also been obtained by improving properties of conventionally known resins. For example, there are disclosed techniques providing a radiation-sensitive resin composition having excellent properties by using a novolak resin with a particular molecular weight distribution in Japanese Unexamined Patent Publication Nos. S60-140235 and H1-105243 and by using a novolak resin from which low-molecular-weight components of the resin has been removed in Japanese Unexamined Patent Publication Nos. S60-97347, S60-189739 and Japanese Patent Publication No.2590342.

A number of positive-working radiation-sensitive resin compositions containing quinonediazide compounds have been put into practice as a result of various technical developments having so far been made, and the aspect ratio of thickness of radiation-sensitive resin coating to resolved line width has been improved to about 5:1.

On the other hand, degree of integration of integrated circuits of semiconductor elements have been increased year by year and, in the manufacture of semiconductor elements or the like, processing of patterns with a line width of less than sub-micron order has become required. In the uses requiring such super-fine processing, good pattern reproducibility is required as well as high resolution and, from the standpoint of production cost, it is also required to improve throughput (yield per unit time) upon production. Therefore, increasing sensitivity of radiation-sensitive resin composition and reducing dependence of dimensional accuracy upon process are also important factors. However, conventionally known radiation-sensitive resin compositions can not satisfy these requirements at the same time, thus being insufficient.

An object of the present invention is to provide a radiation-sensitive resin composition capable of satisfying all of these conventionally desired properties at the same time, i.e., a radiation-sensitive resin composition which has a high sensitivity and a high resolution, which can form a good pattern with a high aspect ratio, and which provides an excellent throughput upon production and has a small dependence of dimensional accuracy upon process.

DISCLOSURE OF THE INVENTION

As a result of intensive investigations, the inventors have found that the above-described object can be attained by using a positive-working radiation-sensitive resin composition containing a specific radiation-sensitive novolak resin and a specific dissolution inhibitor, thus having achieved the present invention based on the finding.

That is, the present invention is a radiation-sensitive resin composition which contains (i) a radiation-sensitive novolak resin comprising a reaction product between an alkali-soluble novolak resin from which low-molecular-weight components have been removed by a fractional treatment and an o-naphthoquinonediazide compound, or a product obtained by removing low-molecular-weight components by fractional treatment from a reaction product between an alkali-soluble novolak resin and an o-naphthoquinonediazide compound and (ii) a dissolution inhibitor comprising a low-molecular compound represented by the following general formula (I) and having phenolic hydroxyl group or groups:

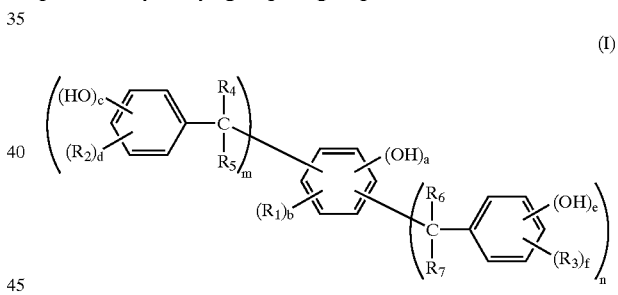

(I)

wherein $R_1$, $R_2$, $R_3$, $R_4$, $R_5$, $R_6$ and $R_7$ each represents independently H, a $C_1$ to $C_4$ alkyl group, a $C_1$ to $C_4$ alkoxyl group, a cyclohexyl group or a group represented by the formula:

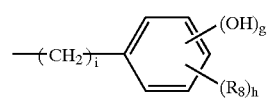

wherein $R_8$ represents H, a $C_1$ to $C_4$ alkyl group, a $C_1$ to $C_4$ alkoxyl group or a cyclohexyl group; each of m and n is 0, 1 or 2; each of a, b, c, d, e, f, g and h is 0 or an integer of 1 to 5 satisfying $a+b \leq 5$, $c+d \leq 5$, $e+f \leq 5$, and $g+h \leq 5$; and i is 0, 1 or 2.

The present invention will now be described more specifically below.

An alkali-soluble novolak resin from which low-molecular-weight components have been removed by fractional treatment to be used as a starting material for preparing the radiation-sensitive novolak resin of the present invention may be manufactured by removing low-molecular-weight components by fractional treatment from the novolak-type phenol resin obtained by polycondensation between at least one of phenols and an aldehyde such as formalin.

As the phenols to be used for manufacturing this alkali-soluble novolak resin, there may be illustrated cresols such as o-cresol, p-cresol and m-cresol; xylenols such as 3,5-xylenol, 2,5-xylenol, 2,3-xylenol and 3,4-xylenol; trimethylphenols such as 2,3,4-trimethylphenol, 2,3,5-trimethylphenol, 2,4,5-trimethylphenol and 3,4,5-trimethylphenol; t-butylphenols such as 2-t-butylphenol, 3-t-butylphenol and 4-t-butylphenol; methoxyphenols such as 2-methoxyphenol, 3-methoxyphenol, 4-methoxyphenol, 2,3-dimethoxyphenol, 2,5-dimethoxyphenol and 3,5-dimethoxyphenol; ethylphenols such as 2-ethylphenol, 3-ethylphenol, 4-ethylphenol, 2,3-diethylphenol, 3,5-diethylphenol, 2,3,5-triethylphenol and 3,4,5-triethylphenol; chlorophenols such as o-chlorophenol, m-chlorophenol, p-chlorophenol and 2,3-dichlorophenol; resorcinols such as resorcinol, 2-methylresorcinol, 4-methylresorcinol and 5-methylresorcinol; catechols such as 5-methylcatechol; pyrogallols such as 5-methylpyrogallol; bisphenols such as bisphenol A, B, C, D, E or F; methylol-cresols such as 2,6-dimethylol-p-cresol; naphthols such as α-naphthol, β-naphthol, etc.; and the like. These are used independently or as a mixture of two or more thereof.

As the aldehydes, there may be used salicylaldehyde, paraformaldehyde, acetaldehyde, benzaldehyde, hydroxybenzaldehyde, chloroacetaldehyde, etc. independently or as a mixture of two or more thereof as well as formalin.

The polycondensation between at least one of phenols and an aldehyde such as formalin may be conducted by any conventionally known or well-known processes such as using, for example, oxalic acid as a catalyst. As a method of fractional treatment for removing low-molecular-weight components from the novolak resin obtained, any conventionally known processes may be adapted. The method of fractional treatment include e.g. liquid-liquid fractionation of novolak resin using two different solvents having different dissolution abilities to the component of the resin, a method of removing low-molecular-weight components by centrifugation, etc.

Removal of the low-molecular-weight components from the novolak resin may be conducted after reaction between the novolak resin and the o-naphthoquinonediazide compound. However, the removal is preferably conducted before reaction of the two since there is no fear of the photosensitizer being deactivated by the heat applied upon fractional treatment and from the standpoint of the safety. Additionally, the fractional treatment of the reaction product can be conducted in the same manner as with fractional treatment of novolak resins.

The alkali-soluble novolak resin to be used in the present invention from which low-molecular-weight components have been removed must show a dissolution rate of 10–180 Å/sec, preferably 20–150 Å/sec, for a 2.38 wt % aqueous solution of tetramethylammonium hydroxide measured according to the following "method for measuring dissolution rate of novolak resin". If the dissolution rate is less than 10 Å/sec, such novolak resin can cause reduction in sensitivity and remaining of undissolved matter, and fails to provide enough resolution, whereas if more than 180 Å/sec, there results such a decrease in film thickness after development that good patterns are hardly obtained.
(Method for Measuring Dissolution Rate of Novolak Resin)

20 g of novolak resin is dissolved in 80 g of a mixed solvent of ethyl lactate/n-butyl acetate (85/15), then filtered through a 0.5 μm Teflon filter. The resulting resin solution is coated on a HMDS-treated 4-inch silicon wafer using a spin coater, LARC ULTIMA-1000 made by Lithotec Japan Co. in a thickness of about 1 μm after being baked at 100° C. for 90 seconds on a hot plate. After baking at 100° C. for 90 seconds on a hot plate, thickness of the coating is accurately measured by means of an apparatus for measuring film thickness, Lambda Ace made by Dainippon Screen Co., Ltd. Thereafter, the thus obtained silicon wafer is dipped in an alkaline developer solution, AZ® 300MIF Developer (a 2.38 wt % aqueous solution of tetramethylammonium hydroxide) made by Clariant (Japan) K. K. at 23° C., and the time necessary for the resin coating on the wafer to be completely dissolved is measured. Dissolution rate of novolak resin is calculated from the coating thickness and the dissolution time thus measured.

On the other hand, o-naphthoquinonediazide compounds to be used as starting material for manufacturing the radiation- sensitive novolak resin of the present invention may be any of those which have conventionally been known as a photosensitizer for radiation-sensitive resin compositions or have conventionally been used in manufacturing a photosensitizer and which keep their radiation sensitivity even after reaction with novolak resin. As the o-naphtoquinonediazide compound there may be illustrated, for example, 1,2-naphthoquinonediazide sulfonic acid halides such as 1,2-naphthoquinonediazide-4-sulfonic acid chloride, 1,2-naphthoquinonediazide-5-sulfonic acid chloride, 1,2-naphthoquinonediazide-6-sulfonic acid chloride and the like. These o-naphtoquinonediazide compounds may be used independently or as a mixture of two or more thereof. The radiation-sensitive novolak resin of the present invention may be a single radiation-sensitive novolak resin or a mixture of two or more of radiation-sensitive novolak resins. In the case of using a mixture of two or more radiation-sensitive novolak resins as the radiation-sensitive novolak resin, such radiation-sensitive novolak resins may be prepared by respectively reacting novolak resins with a single different o-naphthoquinonediazide compound, followed by mixing these two or more radiation-sensitive novolak resins or, alternatively, by reacting previously mixed o-naphthoquinonediazide compounds with novolak resin, with the former manner of independently reacting o-naphthoquinonediazide compound with novolak resin being preferred. The preferable examples of o-naphthoquinonediazide compound in the present invention are 1,2-naphthoquinonediazide-5-sulfonic acid chloride alone and the combination of 1,2-naphthoquinonediazide-4-sulfonic acid chloride and 1,2-naphthoquinonediazide-5-sulfonic acid chloride.

The reaction between the alkali-soluble novolak resin and the o-naphthoquinonediazide compound may be carried out in any of conventionally known manners, for example, by dissolving both the alkali-soluble novolak resin and the o-naphthoquinonediazide sulfonic acid chloride in a solvent, and dropwise adding an organic amine solution to this solution. As to reaction substitution ratio of the o-naphthoquinonediazide compound to the alkali-soluble novolak resin from which low-molecular-weight components have been removed, 3–25 mol % based on hydrogen atom of hydroxyl group of said novolak resin is preferred, with 4–15 mol % being more preferred. If the reaction substitution ratio is less than 3 mol %, intended resolution is hardly attained, whereas if more than 25 mol %, there tends to result a positive pattern with undeveloped residues.

As the low-molecular compound to be used as a dissolution inhibitor in the radiation-sensitive resin composition of the present invention, which is represented by the above general formula (I) and has a phenolic hydroxyl group or groups, there are illustrated, for example, 4,4',4"-methylidinetrisphenol, 2,6-bis[(2-hydroxy-5-methylphenol) methyl]-4-methylphenol, 4,4'-[1-[4-[1-(4-hydroxyphenyl)-1-methylethyl]phenyl]ethylidene]bisphenol, 4,4',4"-ethylidinetrisphenol, 4-[bis(4-hydroxyphenyl)methyl]-2-ethoxyphenol, 4,4'-[(2-hydroxyphenyl)methylene]bis[2,3-dimethylphenol], 4,4'-[(3-hydroxyphenyl)methylene]bis[2,6-dimethylphenol], 4,4'-[(4-hydroxyphenyl)methylene]bis[2,6-dimethylphenol], 2,2'-[(2-hydroxyphenyl)methylene]bis[3,5-dimethylphenol], 2,2'-[(4-hydroxyphenyl)methylene]bis[3,5-dimethylphenol], 4,4'-[(3,4-dihydroxyphenyl)methylene]bis [2,3,6-trimethylphenol], 4-[bis(3-cyclohexyl-4-hydroxy-6-methylphenyl)methyl]-1,2-benzenediol, 4,6-bis[(3,5-dimethyl-4-hydroxyphenyl) methyl]-1,2,3-benzenetriol, 4,4'-[(2-hydroxyphenyl) methylene]bis[3-methylphenol], 4,4',4"-(3-methyl-1-propanyl-3-ylidine)trisphenol, 4,4',4",4'"-(1,4-phenylenedimethylidine)tetrakisphenol, 2,4, 6-tris[(3,5-dimethyl-4-hydroxyphenyl)methyl]-1,3-benzenediol, 2,4,6-tris[(3,5-dimethyl-2-hydroxyphenyl)methyl]-1,3-benzenediol, 4,4'-[1-[4-[1-[4-hydroxy-3,5-bis[(hydroxy-3-methylphenyl)methyl]phenyl]-1-methylethyl]phenyl] ethylidene]bis[2,6-bis(hydroxy-3-methylphenyl)methyl] phenol, and the like. These low-molecular compounds having phenolic hydroxyl group or groups are used in an amount of usually 2 to 20 parts by weight, preferably 5 to 15 parts by weight, per 100 parts by weight of the radiation-sensitive novolak resin.

The radiation-sensitive novolak resin and the dissolution inhibitor of low-molecular compound having a phenolic hydroxyl group or groups of the present invention are dissolved in a solvent to form a positive-working radiation-sensitive resin composition. The solvent for dissolving these components includes ethylene glycol monoalkyl ethers such as ethylene glycol monomethyl ether and ethylene glycol monoethyl ether; ethylene glycol monoalkyl ether acetates such as ethylene glycol monomethyl ether acetate and ethylene glycol monoethyl ether acetate; propylene glycol monoalkyl ethers such as propylene glycol monomethyl ether and propylene glycol monoethyl ether; propylene glycol monoalkyl ether acetates such as propylene glycol monomethyl ether acetate and propylene glycol monoethyl ether acetate; lactates such as methyl lactate and ethyl lactate; aromatic hydrocarbons such as toluene and xylene; ketones such as methyl ethyl ketone, 2-heptanone and cyclohexanone; amides such as N,N-dimethylacetamide and N-methylpyrrolidone; and lactones such as γ-butyrolactone. These solvents can be used independently or as a mixture of two or more thereof.

A photosensitizer containing a quinonediazide group may be incorporated into the positive-working radiation-sensitive resin composition of the present invention as necessary. The photosensitizer is obtained by allowing naphthoquinonediazidesulfonic acid chloride or benzoquinonediazidesulfonic acid chloride to react with a low-molecular or high-molecular compound having a functional group capable of condensation reaction with these acid chlorides. The functional group that can be condensed with an acid chloride includes a hydroxyl group, an amino group etc. Among these, a hydroxyl group is particularly preferable. The compound containing a hydroxyl group includes e.g. hydroquinone; resorcinol; hydroxybenzophenones such as 2,4-dihydroxybenzophenone, 2,3,4-trihydroxybenzophenone, 2,4,6-trihydroxybenzophenone, 2,4,4'-trihydroxybenzophenone, 2,3,4,4-tetrahydroxybenzophenone, 2,2',4,4'-tetrahydroxybenzophenone and 2,2',3,4,6'-pentahydroxybenzophenone; hydroxyphenylalkanes such as bis(2,4-dihydroxyphenyl)methane, bis(2,3,4-trihydroxyphenyl)methane and bis(2,4-dihydroxyphenyl) propane; and hydroxytriphenylmethanes such as 4,4',3",4"-tetrahydroxy-3,5,3',5'-tetramethyltriphenylmethane and 4,4', 2",3",4"-pentahydroxy-3,5,3',5'-tetramethyltriphenylmethane. These can be used independently or as a combination of two or more thereof.

Dyestuffs, adhesive aids, surfactants etc. conventionally used as additives of the radiation-sensitive resin composition may be incorporated as necessary into the radiation-sensitive resin composition of the present invention. The dyestuffs include e.g. Methyl Violet, Crystal Violet, Malachite Green etc.; the adhesive aids include e.g. alkyl imidazoline, butyric acid, alkyl acid, polyhydroxystyrene, polyvinylmethyl ether, t-butyl novolak, epoxy silane, epoxy polymer, silane etc.; and the surfactants include e.g. nonionic surfactants such as polyglycols and derivatives thereof, that is, polypropylene glycol or polyoxyethylene lauryl ether, fluorine-containing surfactants such as Fluorad (trade name; manufactured by Sumitomo 3M Ltd.), Megafac (trade name; manufactured by Dainippon Ink & Chemicals, Inc.), Sulflon (trade name; manufactured by Asahi Glass Co., Ltd.) or organosiloxane surface active agents such as KP341 (trade name; Shin-Etsu Chemical Co., Ltd.).

Furthermore, the radiation-sensitive resin composition of the present invention may be used in combination with an inorganic anti-reflective coating of TiN, SiN, SiON or the like or an organic anti-reflective coating of AZ® BARLi, AZ® BARLi II (manufactured by Clariant (Japan) K. K.).

The positive-working radiation-sensitive resin composition of the present invention is applied on a substrate such as a silicon wafer having an anti-reflective coating thereon, by spin coating or the like, and the substrate on which the radiation-sensitive resin composition has been coated is subjected to baking to form a radiation-sensitive resin coating. The substrate having thereon the radiation-sensitive resin coating is exposed with radiation such as ultraviolet rays, deep ultraviolet rays, X-rays or electron beams and is developed with an alkaline developing solution to form a resist pattern with high resolution and good pattern profile.

BEST MODE FOR PRACTICING THE INVENTION

The present invention will now be described more specifically by reference to Examples which, however, are not to be construed to limit the present invention in any way.

SYNTHESIS EXAMPLE 1

Figure 1:
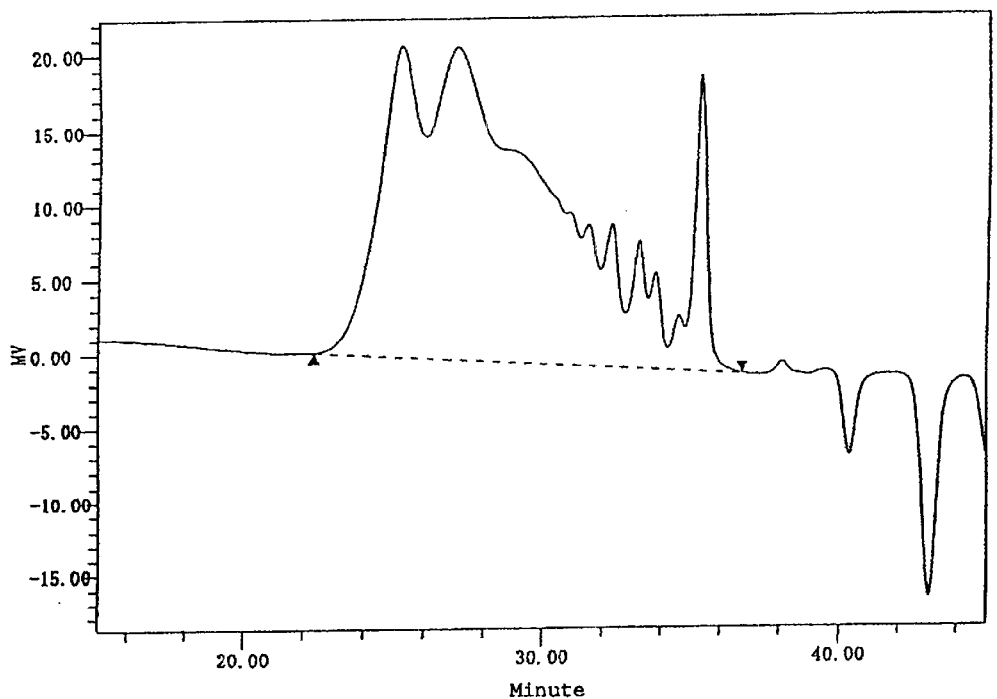
FIG. 1 shows a GPC chart of novolak resin A prepared in Synthesis Example 1.

Synthesis and Fractional Treatment of Novolak Resin 80 g of m-cresol, 120 g of p-cresol, 112 g of a 37% formalin aqueous solution and 0.32 g of oxalic acid were charged in a 1-liter separable flask equipped with a stirrer, a condenser and a thermometer, and heated to 100° C. under stirring, followed by reacting for 16 hours. Thereafter, the temperature was raised to 200° C., and the pressure was gradually reduced to 1 mmHg to thereby remove water, unreacted cresol monomer, formaldehyde, oxalic acid, etc. Then, molten novolak resin was taken out of the flask and cooled to room temperature to solidify and recover the reaction product. Molecular weight of the thus obtained novolak resin A was measured according to gel permeation chromatography (GPC). Results of the measurement are shown in FIG. 1. Weight average molecular weight of the novolak resin A as determined using polystyrene standards was 6,800, dispersing degree (Mw/Mn) was 10.5, and contents of dimer, trimer and tetramer were 12.1%, 4.2% and 4.5%, respectively. Dissolution rate of the novolak resin A for a 2.38 wt % aqueous solution of tetramethylammonium hydroxide was 199 Å/sec.

Figure 2:
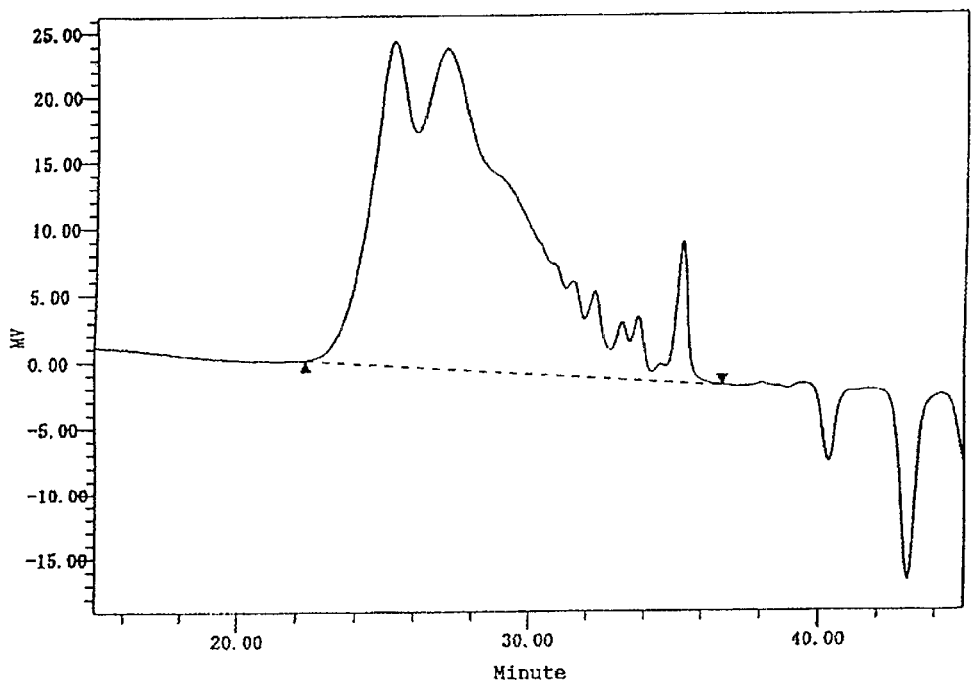
FIG. 2 shows a GPC chart of novolak resin B prepared by subjecting novolak resin A prepared in Synthesis Example 1 to fractional treatment.

Then, 100 g of this novolak resin A was completely dissolved in 234 g of methanol and 83.5 g of pure water was gradually added thereto under stirring. After stirring for 10 minutes, 83.5 g of pure water was further added gradually thereto under stirring. A precipitate formed during stirring was filtered away. Further, this procedure cycle of dissolution in methanol, washing with pure water and filtration was repeatedly conducted to obtain a white resin component. This resin component was heated to 40° C. and dried for 48 hours under reduced pressure to obtain novolak resin B. Molecular weight of the novolak resin B was measured according to GPC. Results of the measurement are shown in FIG. 2. The novolak resin B had a weight average molecular weight of 8,000 as determined using polystyrene standards, a dispersing degree of 7.9, contents of dimer, trimer and tetramer of 7.1 %, 2.2 % and 3.3 %, respectively, and a dissolution rate of 40 Å/sec for a 2.38 wt % aqueous solution of tetramethylammonium hydroxide.

Additionally, measurement according to GPC was conducted as follows.

GPC columns made by Showa Denko K. K. (one column of KF-804, two columns of KF-802 and one column of KF-801) were used, and measurement was conducted at a flow rate of 1.0 ml/min and at a column temperature of 40° C. using tetrahydrofuran (THF) for liquid chromatography grade as a mobile phase.

SYNTHESIS EXAMPLE 2
Synthesis of Radiation-sensitive Novolak Resin 60 g of the fractionation-treated novolak resin B prepared in Synthesis Example 1, 6.71 g of 1,2-naphthoquinonediazide-5-sulfonyl chloride and 250 g of acetone were charged in a 1-liter, three-necked separable flask equipped with a stirrer, a dropping funnel and a thermometer, and stirred to completely dissolve. Then, the flask was dipped in an ice-bath till the temperature of the contents in the flask decreased to 15° C. Then, 3.83 ml of triethylamine was dissolved in 25 ml of acetone and charged in the dropping funnel, then dropwise added to the mixture in the flask over one hour. After stirring for further 10 minutes, the contents inside the flask were filtered to remove triethylamine hydrochloride. Thereafter, the filtrate was gradually added dropwise to 4, 000 ml of 0.1 N hydrochloric acid aqueous solution to obtain a precipitate. This precipitate was washed with water, filtered out, and dried at 40° C. for 42 hours under reduced pressure to obtain radiation-sensitive novolak resin C.

EXAMPLE 1

45 g of radiation-sensitive novolak resin C, 5 g of a low-molecular compound represented by the following formula (D-1) as a dissolution inhibitor, and 0.05 g of a surfactant, Megafac R-08 (made by Dainippon Ink & Chemicals, Inc.) were dissolved in 80 g of a mixed solvent of ethyl lactate/n-butyl acetate (85/15). This solution was filtered through a 0.5 μm Teflon filter to obtain positive-working radiation-sensitive resin composition 1.

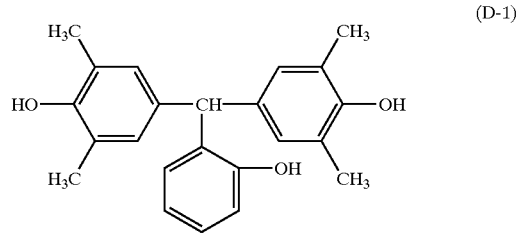

(D-1)

The thus obtained positive-working radiation-sensitive resin composition 1 was evaluated with respect to sensitivity, resolution, pattern form, scumming, and micro-grooving properties according to the following "evaluation of radiation-sensitive resin composition". Results thus obtained are tabulated in Table 1.

(Evaluation of Radiation-sensitive Resin Composition)

A radiation-sensitive resin composition is coated on a HMDS-treated 4-inch silicon wafer using as a coater a spin coater, LARC ULTIMA-1000 made by Lithotec Japan Co. in a thickness of about 6 μm after being pre-baked at 110° C. for 120 seconds on a hot plate. After the coating, the radiation-sensitive resin coating was pre-baked at 110° C. for 120 seconds on a hot plate, and thickness of the thus formed radiation-sensitive resin coating is measured by means of a film thickness-measuring apparatus, Lambda Ace made by Dainippon Screen Co., Ltd. This silicon wafer is exposed using a reduction projection aligner having an exposing wavelength of 365 nm (made by Hitachi Ltd.: LD-5015iCW, NA=0.50) with stepwise changing the exposure amount. After the exposure, the wafer is developed by dipping in an alkaline developer (AZ® 300MIF developer, a 2.38 wt % aqueous solution of tetramethylammonium hydroxide) made by Clariant (Japan) K. K. at 23° C. for 5 minutes to obtain a positive resist pattern. Sensitivity, resolution, form of pattern, scumming and microgrooving properties are evaluated based on the thus obtained results according to the following estimation standards.

(1) Sensitivity

Exposure energy capable of forming isolated 0.80 μm space as designed by a reticle pattern.

(2) Resolution

Minimum pattern dimension resolved by the above-described exposure amount.

(3) Form of Pattern

Cross-sectional form of the isolated space on the wafer on which a resist pattern has been formed is observed under a scanning electron microscope (SEM), and form of pattern is rated according to the following criteria:

○: No reduction in coating thickness observed, and increase of pattern dimension at a height of 2/3 of the resist coating thickness from the substrate being less than +10% based on the bottom dimension of the isolated space;

Δ: No reduction in coating thickness observed, and increase of the pattern dimension being +10% to less than +15%;

X: Increase of the pattern dimension being +15% or more, or some reduction in coating thickness observed.

(4) Scumming

Form of isolated pattern at a critical resolution degree is observed under a scanning electron microscope (SEM), and scumming is rated according to the following criteria:

○: No undeveloped residues observed on the substrate and at the interface with resist pattern.

X: Undeveloped residues observed.

(5) Microgrooving

Isolated space pattern at the critical resolution degree is observed under a scanning electron microscope (SEM), and presence of microgrooving is rated according to the following criteria:

○: No bites observed at the interface between resist pattern and the substrate.

X: Bites of pattern observed.

EXAMPLE 2

In the same manner as in Example 1 except for using as a dissolution inhibitor a low-molecular compound represented by the following formula (D-2) in place of the low-molecular compound represented by the formula (D-1), there was obtained a positive-working radiation-sensitive resin composition 2.

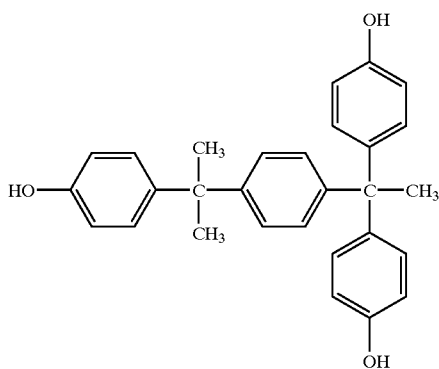

(D-2)

Sensitivity, resolution, form of pattern, scumming and microgrooving properties of the positive-working radiation-sensitive resin composition 2 were evaluated in the same manner as in Example 1. Results thus obtained are tabulated in Example 1.

Comparative Example 1

50 g of fractionation-treated radiation-sensitive novolak resin C and 0.05 g of a surfactant of Megafac R-08 (product of Dainippon Ink & Chemicals, Inc.) were dissolved in 80 g of a mixed solvent of ethyl lactate/butyl acetate (85/15). This solution was filtered through a 0.5 μm Teflon filter to obtain a positive-working radiation-sensitive resin composition 3. Sensitivity, resolution, form of pattern, scumming and microgrooving properties of the positive-working radiation-sensitive resin composition 3 were evaluated in the same manner as in Example 1. Results thus obtained are tabulated in Table 1.

Comparative Example 2

Radiation-sensitive novolak resin E was obtained in the same manner as with radiation-sensitive novolak resin C except for using novolak resin A not having been subjected to fractional treatment. 50 g of the thus obtained radiation-sensitive novolak resin E and 0.05 g of a surfactant of Megafac R-08 (product of Dainippon Ink & Chemicals, Inc.) were dissolved in 80 g of a mixed solvent of ethyl lactate/butyl acetate (85/15). This solution was filtered through a 0.5 pm Teflon filter to obtain a positive-working radiation-sensitive resin composition4. Sensitivity, resolution, form of pattern, scumming and microgrooving properties of the positive-working radiation-sensitive resin composition 4 were evaluated in the same manner as in Example 1. Results thus obtained are tabulated in Table 1.

Comparative Example 3

45 g of the radiation-sensitive novolak resin E, 5 g of a low-molecular compound represented by the formula (D-1) as a dissolution inhibitor, and 0.05 g of a surfactant of Megafac R-08 (product of Dainippon Ink & Chemicals, Inc.) were dissolved in 80 g of a mixed solvent of ethyl lactate/butyl acetate (85/15). This solution was filtered through a 0.5 μm Teflon filter to obtain a positive-working radiation-sensitive resin composition 5. Sensitivity, resolution, form of pattern, scumming and microgrooving properties of the positive-working radiation-sensitive resin composition 5 were evaluated in the same manner as in Example 1. Results thus obtained are tabulated in Table 1.

TABLE 1

| | Radiation-sensitive novolak resin | | Low-molecular phenol compound | | | | | | |
|---|---|---|---|---|---|---|---|---|---|
| | Name | Additive amount | Name | Additive amount | Sensitivity (mJ/cm$^2$) | Resolution (μm) | Form of pattern | Scumming | Microgrooving |
| Example 1 | C | 90 | D-1 | 10 | 620 | 0.55 | ○ | ○ | ○ |
| Example 2 | C | 90 | D-2 | 10 | 585 | 0.55 | ○ | ○ | ○ |
| Comparative Example 1 | C | 100 | — | — | 920 | 0.80 | × | × | × |
| Comparative Example 2 | E | 100 | — | — | 730 | 0.60 | ○ | × | × |
| Comparative Example 3 | E | 90 | D-1 | 10 | 530 | 0.70 | Δ | × | × |

As is apparent from Table 1, the positive-working radiation-sensitive resin compositions of the present invention show excellent sensitivity and resolution, form a pattern with good shape, form no scum, and show excellent microgrooving properties.

Advantages of the Invention

As has been described in detail, the positive-working radiation-sensitive resin composition of the present invention can show high sensitivity and high resolution and can form a pattern with good shape and a high aspect ratio. In addition, it shows a good throughput upon production of semiconductors or the like and less process dependence of dimensional accuracy. Thus, it is extremely useful as a resist material for manufacturing semiconductor elements, production of display surface of LCD panel, production of circuit substrate of thermal heads, etc. wherein micropatterning will become finer in the future.

Industrial Utility

The positive-working radiation-sensitive resin composition of the present invention can be preferably used as a resist material for manufacturing semiconductor elements, production of display surface of LCD panel, production of circuit substrate of thermal heads and the like.

What is claimed is:

1. A positive-working radiation-sensitive resin composition containing (i) a radiation-sensitive novolak resin comprising a reaction product between an alkali-soluble novolak resin from which low-molecular-weight components comprising dimers, trimers and tetramers have been removed by fractional treatment and an o-naphthoquinonediazide compound, or a product obtained by removing low-molecular-weight components comprising dimers, trimers and tetramers by fractional treatment from a reaction product between an alkali-soluble novolak resin and an o-naphthoquinonediazide compound, and (ii) a low-molecular compound represented by the general formula (I) and having phenolic hydroxyl group or groups:

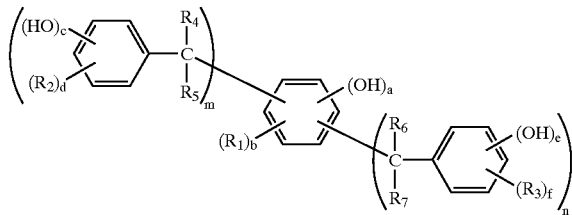

wherein $R_1$, $R_2$, $R_3$, $R_4$, $R_5$, $R_6$ and $R_7$ each represents independently H, a $C_1$ to $C_4$ alkyl group, a $C_1$ to $C_4$ alkoxyl group, a Cyclohexyl group or a group represented by the formula:

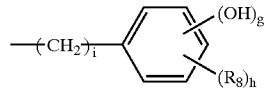

wherein $R_8$ represents H, a $C_1$ to $C_4$ alkyl group, a $C_1$ to $C_4$ alkoxyl group or a cyclohexyl group; each of m and n is 0, 1 or 2; each of a, b, c, d, e, f, g and h is 0 or an integer of 1 to 5 satisfying $a+b \leq 5$, $c+d \leq 5$, $e+f \leq 5$, and $g+h \leq 5$; and I is 0, 1 or 2; wherein said fractional treatment comprises removal of substantial amounts of said dimers, trimers and tetramers by precipitation.

2. The positive-working radiation-sensitive resin composition according to claim 1 wherein the dissolution rate of the alkali-soluble novolak resin from which low-molecular-weight components have been removed by fractional treatment, for a 2.38 wt % aqueous solution of tetramethylammonium hydroxide, ranges from 10 to 180 Å/sec.

3. The positive-working radiation-sensitive resin composition according to claim 1 wherein the alkali-soluble novolak resin from which low-molecular-weight components have been removed by fractional treatment has a weight average molecular weight of 3,000 to 15,000 as determined using polystyrene standards, and the reaction substitution ratio of the o-naphthoquinonediazide compound based on hydrogen atom of hydroxyl group in said alkali-soluble novolak resin is 3 to 25 mol %.

4. The positive-working radiation-sensitive resin composition according to claim 1 wherein the low-molecular compound containing phenolic hydroxyl group or groups represented by the general formula (I) is contained in an amount of 0.5 to 20 parts by weight relative to 100 parts by weight of the alkali-soluble novolak resin from which low-molecular-weight components have been removed by fractional treatment.

* * * * *